(12) United States Patent
Schwarz et al.

(10) Patent No.: US 8,477,814 B2
(45) Date of Patent: Jul. 2, 2013

(54) SEMICONDUCTOR LASER MODULE

(75) Inventors: Thomas Schwarz, Regensburg (DE);
Michael Kuehnelt, Regenburg (DE);
Roland Schulz, Regensburg (DE);
Juergen Dachs, Baar-Ebenhausen (DE);
Ulrich Steegmueller, Northville, MI (US); Heiko Unold, Neutraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/371,077

(22) Filed: Feb. 13, 2009

(65) Prior Publication Data

US 2009/0232170 A1    Sep. 17, 2009

(30) Foreign Application Priority Data

Feb. 14, 2008    (DE) .......................... 10 2008 009 110

(51) Int. Cl.
*H01S 3/10*    (2006.01)

(52) U.S. Cl.
USPC .............. 372/22; 372/21; 372/43.01; 372/71; 372/93

(58) Field of Classification Search
USPC ............................... 372/21, 22, 43.01, 71, 93
See application file for complete search history.

(56) References Cited

U.S. PATENT DOCUMENTS

| | | | |
|---|---|---|---|
| 5,436,920 A | 7/1995 | Minemoto et al. | |
| 5,991,318 A | 11/1999 | Caprara et al. | |
| 6,047,009 A * | 4/2000 | Adachi et al. | 372/21 |
| 6,167,068 A | 12/2000 | Caprara et al. | |
| 2003/0067950 A1* | 4/2003 | Hanaoka | 372/34 |
| 2003/0112500 A1* | 6/2003 | Miki et al. | 359/344 |
| 2005/0226282 A1* | 10/2005 | Lawrence et al. | 372/20 |
| 2007/0091944 A1* | 4/2007 | Ruiz | 372/22 |
| 2007/0091964 A1* | 4/2007 | Lutgen | 372/50.124 |
| 2007/0165689 A1* | 7/2007 | Lee et al. | 372/99 |
| 2007/0263686 A1* | 11/2007 | Kim et al. | 372/43.01 |
| 2007/0268941 A1 | 11/2007 | Kim et al. | |
| 2009/0246898 A1 | 10/2009 | Steegmuller et al. | |
| 2009/0252188 A1* | 10/2009 | Rossi et al. | 372/34 |

FOREIGN PATENT DOCUMENTS

| | | |
|---|---|---|
| DE | 10 2004 012 014 | 10/2005 |
| DE | 69923577 | 2/2006 |
| DE | 10 2005 053 274 | 4/2007 |
| DE | 10 2006 017 293 | 7/2007 |
| DE | 10 2006 017 294 | 7/2007 |
| EP | 1 125 350 | 9/1999 |
| JP | 7-99360 | 4/1995 |
| JP | 2002-528921 | 9/2002 |
| JP | 2007-311780 | 11/2007 |
| JP | 2009-522757 | 6/2009 |
| WO | WO 00/25399 | 5/2000 |
| WO | WO 2007/076841 | 7/2007 |
| WO | WO 2007/076845 | 7/2007 |

* cited by examiner

*Primary Examiner* — Yuanda Zhang
(74) *Attorney, Agent, or Firm* — Cozen O'Connor

(57) ABSTRACT

A semiconductor laser module is disclosed, comprising a module carrier (20) having a mounting area (21), a pump device (1) arranged on the mounting area (21), a surface emitting semiconductor laser (40) arranged on the mounting area (21), and a frequency conversion device (6) arranged on the mounting area (21), wherein the mounting area (21) of the module carrier (20) has an area content of at most 100 mm².

12 Claims, 7 Drawing Sheets

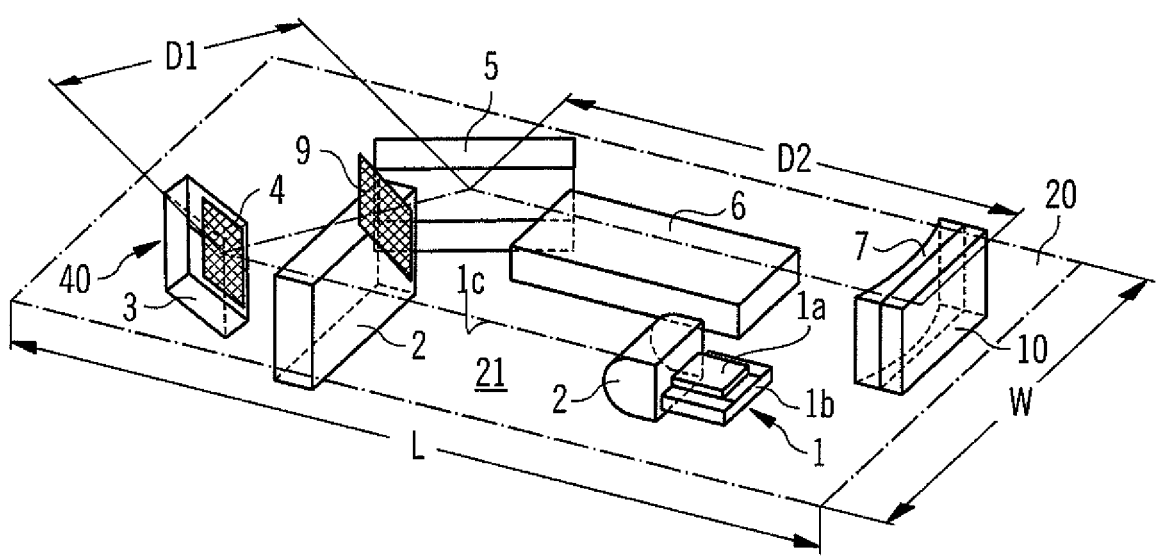

SEMICONDUCTOR LASER MODULE

RELATED APPLICATIONS

This patent application claims the priority of German patent application 10 2008 009 110.3 filed Feb. 14, 2008, the disclosure content of which is hereby incorporated by reference.

FIELD OF THE INVENTION

A semiconductor laser module is specified.

BACKGROUND OF THE INVENTION

The document EP 1125350 describes a semiconductor laser module.

SUMMARY OF THE INVENTION

One object of the invention is to provide a particularly compact semiconductor laser module.

In accordance with at least one embodiment of the semiconductor laser module, the semiconductor laser module comprises a module carrier. The module carrier is for example a circuit board composed of DBC (direct bonded copper) or a board composed of an electrically insulating, for example ceramic, material whose surface can be provided with metallizations in places.

The module carrier has a mounting area. The mounting area is provided by part of the surface of the module carrier. By way of example, the mounting area is formed by a top side of the module carrier.

In accordance with at least one embodiment of the semiconductor laser module, a pump device is arranged on the mounting area. The pump device comprises for example a pump radiation source such as an edge emitting semiconductor laser chip, and also a heat sink to which the pump source is applied. The pump device is preferably fixed mechanically firmly on the mounting area. By way of example, the pump device can be soldered or adhesively bonded onto the mounting area of the module carrier.

In accordance with at least one embodiment of the semiconductor laser module, the semiconductor laser module comprises a surface emitting semiconductor laser. The surface emitting semiconductor laser comprises for example a mounting block and also at least one semiconductor laser chip fixed to the mounting block. In this case, the at least one semiconductor laser chip can preferably be optically pumped by the pump source of the pump device. Laser radiation can be generated by the semiconductor laser chip in this way. The surface emitting semiconductor laser is preferably fixed mechanically firmly on the mounting area of the module carrier. For this purpose, the surface emitting semiconductor laser can be soldered or adhesively bonded onto the mounting area.

In accordance with at least one embodiment of the semiconductor laser module, the semiconductor laser module comprises a frequency conversion device arranged on the mounting area. The frequency conversion device preferably comprises an optically nonlinear crystal which is suitable and provided for frequency multiplication, for example for frequency doubling, of the laser radiation passing through it. The frequency conversion device is preferably fixed mechanically firmly on the mounting area of the module carrier. It can be soldered on or adhesively bonded on, for example.

In accordance with at least one embodiment of the semiconductor laser module, the mounting area of the module carrier has an area content of at most 100 mm$^2$. By way of example, the module carrier is a parallelepiped. The mounting area is then formed by the top side of the parallelepiped. In this case, the mounting area has an area content of at most 100 mm$^2$. Preferably, the mounting area has an area content of at most 85 mm$^2$, particularly preferably of at most 70 mm$^2$.

In accordance with at least one embodiment of the semiconductor laser module, the semiconductor laser module comprises a module carrier having a mounting area, a pump device arranged on the mounting area, a surface emitting semiconductor laser arranged on the mounting area, and a frequency conversion device arranged on the mounting area. In this case, the mounting area of the module carrier has an area content of at most 100 mm$^2$.

The mounting area is preferably a planar area. By way of example, all the components of the semiconductor laser module are arranged on the mounting area and mechanically firmly connected to the mounting area. In particular, the semiconductor laser module preferably has only a single plane—the plane of the mounting area—in which the components of the semiconductor laser module such as the pump device, the surface emitting semiconductor laser, the frequency conversion device, and further, for example optical, elements are arranged. The mounting area preferably corresponds to the base area of the semiconductor laser module.

In accordance with at least one embodiment of the semiconductor laser module, the semiconductor laser module has a height of at most 3.5 mm, preferably of at most 3 mm. In this case, the height of the semiconductor laser module should be understood to mean the maximum extent of the semiconductor laser module in a direction running perpendicular to the mounting area. That is to say that the distance from the lowest point of the semiconductor laser module to the highest point of the semiconductor laser module is preferably at most 3.5 mm. In this case, the lowest point of the semiconductor laser module is formed for example by that side of the module carrier which is remote from the mounting area. The highest point of the semiconductor laser module is then given for example by a point arranged on that component of the semiconductor laser module which projects the highest above the module carrier.

In accordance with at least one embodiment of the semiconductor laser module, the surface emitting semiconductor laser applied on the semiconductor laser module comprises a mounting block having a top side and a mounting area, wherein at least one semiconductor laser chip is arranged on the top side of the mounting block. By way of example, the semiconductor laser chip can be applied directly to the top side of the mounting block. Furthermore, it is also possible for a heat sink to be arranged between the top side of the mounting block and the semiconductor laser chip, said heat sink being connected mechanically firmly to the top side of the mounting block and also to the at least one semiconductor laser chip.

In this case, the mounting area of the mounting block runs substantially perpendicular to the top side of the mounting block. In this case, substantially perpendicular means that the angle error, that is to say the deviation from the angle of 90°, is at most 0.3°. In this case, the mounting block is arranged and mechanically fixed with its mounting area on the mounting area of the module carrier of the semiconductor laser module. The surface emitting semiconductor laser is therefore arranged on the module carrier of the semiconductor laser module in such a way that the semiconductor laser chip of the surface emitting semiconductor laser can emit the laser radiation generated by it parallel or substantially parallel to the mounting area of the module carrier.

In accordance with at least one embodiment of the semiconductor laser module, the mounting area of the mounting block of the surface emitting semiconductor laser is produced by a singulation process. By way of example, the mounting area can be produced by a laser separating process or sawing. The mounting area can therefore have traces of a singulation process. By way of example, semiconductor laser chips can be applied to a carrier wafer which is subsequently singulated by the singulation process to form mounting blocks having at least one semiconductor laser chip arranged on their top side. In this ways it is possible to produce a multiplicity of surface emitting semiconductor lasers distinguished by a particularly small size. These semiconductor lasers are therefore particularly well suited to creating a compact semiconductor laser module.

In accordance with at least one embodiment of the semiconductor laser module, the mounting block consists of a non-metallic material or contains a non-metallic material. Preferably, the mounting block contains a semiconductor material or a ceramic material or the mounting block consists of a semiconductor material or a ceramic material. The non-metallic materials are particularly well suited to being singulated from a larger carrier wafer to form individual mounting blocks. These non-metallic materials are therefore particularly well suited to producing a mounting block for a semiconductor laser chip which can be used in a particularly compact semiconductor laser module.

In accordance with at least one embodiment of the semiconductor laser module, the mounting block has a substantially uniform thickness of at least 0.5 mm and at most 1.7 mm. In this case, the thickness of the mounting block is the distance between its top side and the underside opposite the top side. A "substantially uniform thickness" means that top side and underside of the mounting block run parallel, or substantially parallel, to one another. In this case, "substantially parallel" means that top side and underside deviate from a plane-parallel course by an angle error of at most 0.1°. A mounting block having such a small thickness is particularly well suited to use in a compact semiconductor laser module with a small area content of the mounting area.

In accordance with at least one embodiment of the semiconductor laser module, the semiconductor laser module furthermore comprises an etalon. The etalon is preferably employed as a frequency-selective element in the semiconductor laser module. In this case, the etalon is arranged on the mounting area of the module carrier. The etalon is preferably mechanically fixed, for example soldered or adhesively bonded, on the mounting area of the module carrier.

In accordance with at least one embodiment of the semiconductor laser module, the etalon comprises a carrier and an etalon layer. The etalon layer consists for example of a glass fixed on the carrier. In particular, the glass can be bonded on the etalon carrier. In this case, the etalon layer, that is to say the glass that the etalon layer consists of, has a uniform thickness of preferably at least 20 µm and preferably at most 50 µm. By way of example, the etalon layer has a thickness of 30 µm.

In accordance with at least one embodiment of the semiconductor laser module, the etalon carrier contains or consists of at least one of the following materials: silicon, glass. These materials are particularly well suited to fixing an etalon layer consisting of glass on the carrier by means of bonding. Furthermore, a particularly thin and thus very compact etalon carrier can be created from these materials. By way of example, the etalon has a constant thickness in a beam direction of at most 0.7 mm. In other words, the thickness of the carrier and the thickness of the etalon layer add up to a total thickness of the etalon of at most 0.7 mm. In this case, the etalon preferably has a thickness of at least 0.3 mm and at most 0.7 mm. A sufficiently mechanical stability of the etalon is thereby ensured.

In this case, the carrier has a uniform height and width of in each case between 1.0 mm and 1.7 mm, for example of 1.5 mm in each case.

The carrier furthermore has a cutout through which the laser beam can pass exclusively through the etalon layer. The diameter of the cutout is between at least 0.5 mm and at most 0.8 mm.

Overall, the etalon described is particularly well suited to creating a compact semiconductor laser module which has a mounting area with a particularly small base area.

In accordance with at least one embodiment of the semiconductor laser module, the etalon is arranged in such a way that no frequency-converted radiation passes through the etalon layer during operation of the semiconductor laser module. For this purpose, the etalon can be arranged for example in the beam path between the surface emitting semiconductor laser and an optical element which couples the laser radiation of the surface emitting semiconductor laser into a part of the laser resonator of the semiconductor laser module in which the frequency conversion device is situated.

In accordance with at least one embodiment of the semiconductor laser module, the resonator of the semiconductor laser module has a length of at most 10 mm. Such a short length of the laser resonator is made possible by the particularly compact arrangement of the components of the semiconductor laser module as described here. In this case, the short resonator length permits high modulation frequencies of the generated laser radiation of >40 MHz, whereby the semiconductor laser module is particularly well suited in particular to applications in image projection.

BRIEF DESCRIPTION OF THE DRAWINGS

The semiconductor laser module described here is explained in more detail below on the basis of exemplary embodiments and the associated figures.

FIGS. 1A to 1C show a first exemplary embodiment of a semiconductor laser module described here.

DETAILED DESCRIPTION OF THE DRAWINGS

In the exemplary embodiments and figures, identical or identically acting constituent parts are in each case provided with the same reference symbols. The elements illustrated should not be regarded as true to scale; rather, individual elements may be illustrated with an exaggerated size in order to afford a better understanding.

Figure 1A:
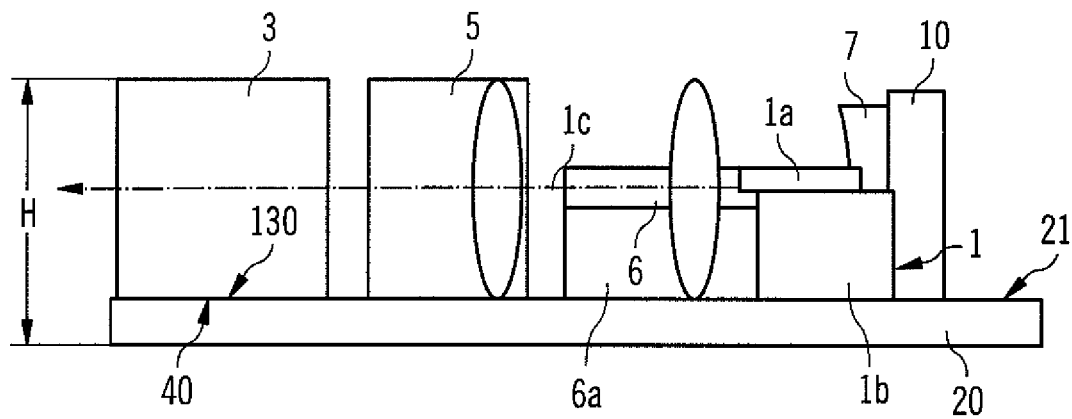
Figure 1B:
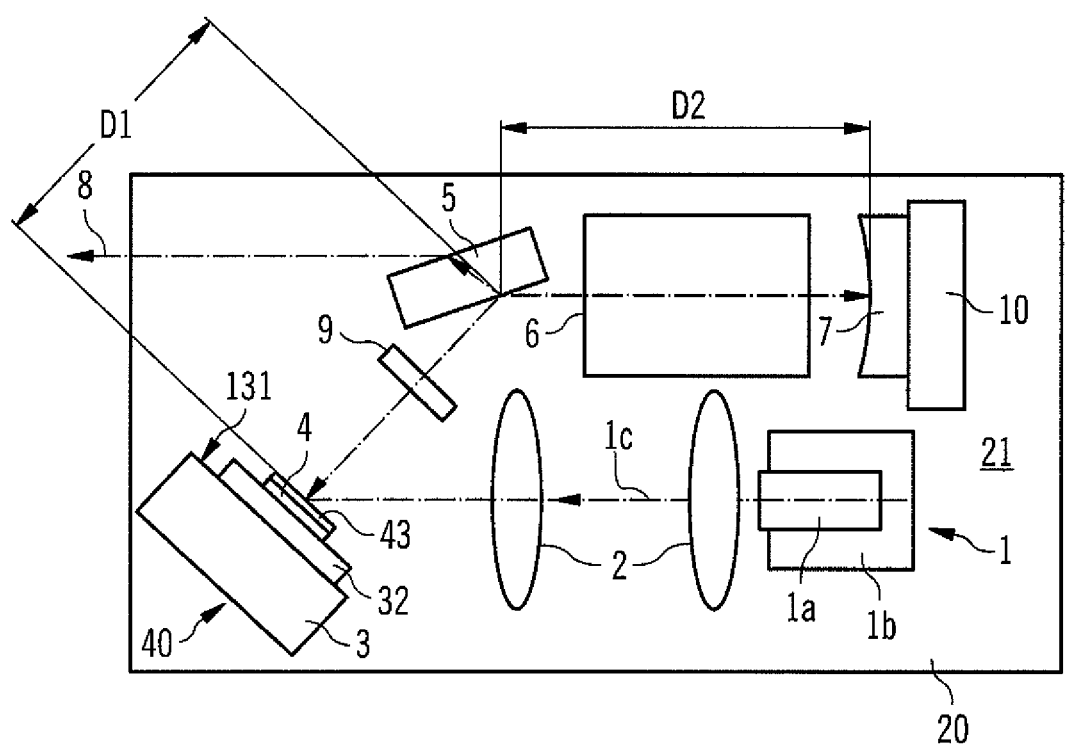

A first exemplary embodiment of a semiconductor laser module described here is explained in more detail with reference to FIGS. 1A to 1C. FIG. 1A shows the semiconductor laser module in accordance with the first exemplary embodiment in a schematic side view. FIG. 1B shows the semiconductor laser module in a schematic plan view. FIG. 1C shows the semiconductor laser module in a schematic perspective illustration. The semiconductor laser module comprises a module carrier 20. The module carrier 20 is a board consisting of direct bonded copper (DBC), for example. Furthermore, it is possible for the module carrier to have a basic body composed of a ceramic material, such as aluminum nitride (AlN) which has at top side and underside metallizations which, for example, consist of copper and have a thickness of between 0.1 mm and 0.3 mm, preferably 0.2 mm.

The module carrier 20 has a mounting area 21 formed by the top side of the module carrier 20. The mounting area of the module carrier 20 is preferably at most 100 $mm^2$, particularly preferably at most 70 $mm^2$. By way of example, the mounting area has a length L of 11 mm and a width W of 6 mm.

The components of the semiconductor laser module are applied to the mounting area 21. By way of example, a pump device 1 is applied to the mounting area 21. The pump device 1 comprises a pump source 1a and a heat sink 1b. The pump source 1a is fixed on that side of the heat sink 1b which is remote from the mounting area 21. The heat sink 1b is applied, for example soldered or adhesively bonded, onto the mounting area 21 by that side of said heat sink which is remote from the pump source 1a. The pump source 1a generates highly divergent pump light. The pump source 1a is for example an edge emitting semiconductor laser such as a broad stripe laser having at least one emitter region. Pump radiation generated by the pump source during operation is focused onto the semiconductor laser chip 4 by the pump optics 2.

The semiconductor laser chip 4 is part of the semiconductor laser 40. The semiconductor laser 40 comprises a mounting block 3, which is fixed, for example soldered or adhesively bonded, with its mounting area 130 on the mounting area 21 of the module carrier 20. The semiconductor laser chip 4 is applied to a heat sink 32 fixed on the side 131 of the mounting block 3. The heat sink 32 is optional in this case. In other words, the semiconductor laser chip 4 can also be applied directly to the mounting block 3 and fixed there. The semiconductor laser chip 4 is mounted on the mounting block 3 or the heat sink 32 by adhesive bonding, soldering or bonding. The pump radiation is focused onto the semiconductor laser chip 4 by the pump optics 2 in such a way that a pump spot having a radius of between approximately 25 μm and at most 60 μm is generated there. The semiconductor laser chip 4 is a surface emitting semiconductor laser chip (VECSEL) which is optically pumped by the pump source 1a. During operation of the semiconductor laser chip 4, the heat flows through the mounting block 3 to the module carrier 20.

The resonator of the semiconductor laser module is defined by a Bragg mirror 43 of the semiconductor laser chip 4 and the end mirror 7. In this case, the reflective surface of the end mirror 7 comprises a coating that is highly reflective to the electromagnetic radiation having a fundamental wavelength as is generated by the semiconductor laser chip, and a coating that is highly reflective to the electromagnetic radiation that is converted in wavelength by the frequency conversion device 6. In this case, the semiconductor laser chip 4 generates for example electromagnetic radiation in the spectral range for infrared radiation, which is converted by the frequency conversion device 6 to form electromagnetic radiation in the spectral range of green light. By way of example, the pump light 1c has a wavelength of 808 nm, the semiconductor laser chip 4 generates radiation having a wavelength of 1060 nm, and the frequency conversion device 6 generates radiation having a wavelength of 530 nm.

The semiconductor laser module has a height H of at most 3.5 mm, preferably at most 3 mm, particularly preferably at most 2.5 mm. In this case, the height H is the distance from the underside of the module carrier 20, remote from the mounting area 21, to the highest point of the semiconductor laser module, formed for example by a component of the semiconductor laser module such as the semiconductor laser 40.

The resonator has a length D1 plus D2 of at most 10 mm.

A wavelength-selective element, for example an etalon 9, is arranged in the resonator. The etalon 9 is described in more detail in conjunction with FIGS. 6A and 6B. It comprises an etalon layer which consists of glass and is at least 10 μm, preferably approximately 30 μm, thick in a beam direction.

Furthermore, the frequency conversion device 6 is arranged in the resonator, said frequency conversion device comprising an optically nonlinear crystal. Furthermore, the frequency conversion device 6 can comprise a heating device 6a arranged between the optically nonlinear crystal and the module carrier 20 on the mounting area 21. The heating device 6a keeps the optically nonlinear crystal at a uniform temperature of above 45° C., for example.

The frequency-converted laser radiation—that is to say the green laser radiation, for example—is coupled out by the coupling-out unit 5, which simultaneously serves as a folding mirror for polarization selection. The coupling-out unit 5 has a coating that is highly reflective to electromagnetic radiation having a fundamental wavelength. Furthermore the coupling-out unit 5 has a coating embodied as antireflective to frequency-converted radiation. In this way, electromagnetic radiation having a fundamental wavelength is kept in the resonator, whereas frequency-converted radiation 8 can leave the semiconductor laser module through the coupling-out unit 5. In the present exemplary embodiment, the coupling-out unit 5 is embodied as a plane mirror for the electromagnetic radiation having a fundamental wavelength. That coating of the coupling-out unit 5 which is embodied as highly reflective to the radiation having a fundamental frequency can be embodied in polarization-establishing fashion. As a result, the coupling-out unit 5 also serves for the polarization spinning of the radiation circulating in the resonator. The coupling-out unit 5 can optionally be arranged at the Brewster angle, which likewise establishes the polarization of the circulating laser radiation.

In principle, all angles between 10 and 180° can be used as folding angle at the coupling-out unit 5 for the electromagnetic radiation having a fundamental wavelength; an angle of 135° is used in the present case.

In the exemplary embodiment described in conjunction with FIGS. 1A to 1C, the end mirror 7 is arranged on a mirror mounting block 10, which can consist for example of silicon, glass or aluminum nitride. The mirror mounting block is optional in this case.

Figure 2A:
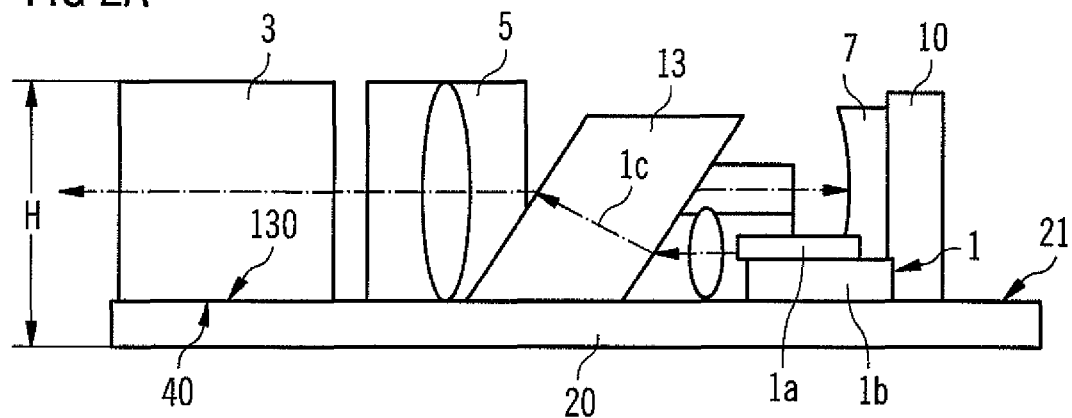
FIGS. 2A and 2B show a second exemplary embodiment of a semiconductor laser module described here.
Figure 2B:
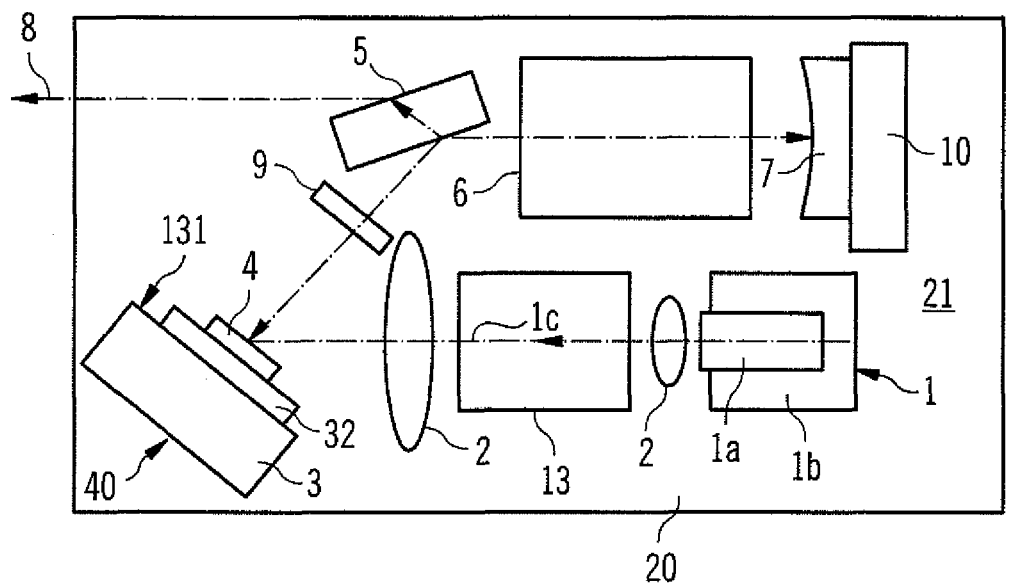

A further exemplary embodiment of a semiconductor laser module described here is described in conjunction with FIGS. 2A and 2B. In this exemplary embodiment the pump path is situated nearer to the mounting area 21 than in the exemplary embodiment described in conjunction with FIGS. 1A to 1C. In other words, the pump radiation 1c generated by the pump device 1 is nearer to the mounting area 21 than in the exemplary embodiment described in conjunction with FIGS. 1A to 1C. In this case, the pump radiation 1c is lifted by means of a beam raising unit 13. The beam raising unit is a parallelepiped, for example. The advantage of this embodiment is that a thinner heat sink 1b is used for the pump source 1a and the pump optics 2 lying nearest to the pump device 1 can be arranged directly on the mounting area 21 without necessitating a mounting pedestal for raising said pump optical system.

Figure 3:
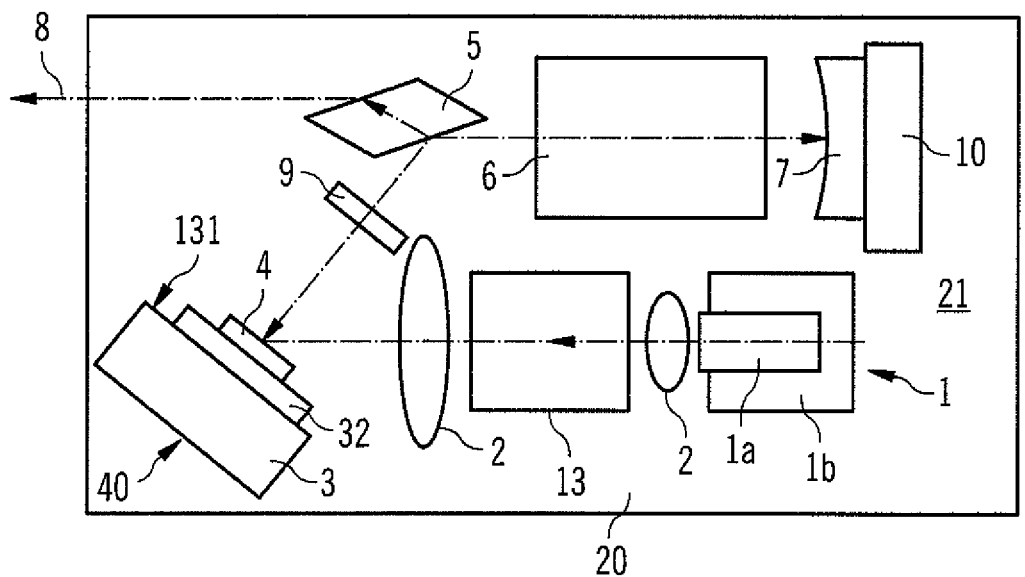
FIG. 3 shows a third exemplary embodiment of a semiconductor laser module described here.

A third exemplary embodiment of a semiconductor laser module described here is explained in more detail in conjunction with FIG. 3. In this exemplary embodiment, the coupling-out unit 5 is not formed by a plane mirror, but rather by a parallelepiped. The parallelepiped is distinguished by a reduced size, with the result that more space is present for example for mounting the etalon 9. As an alternative or in addition to an etalon, some other frequency-selective element such as a birefringent filter, for example, can also be used.

Figure 4:
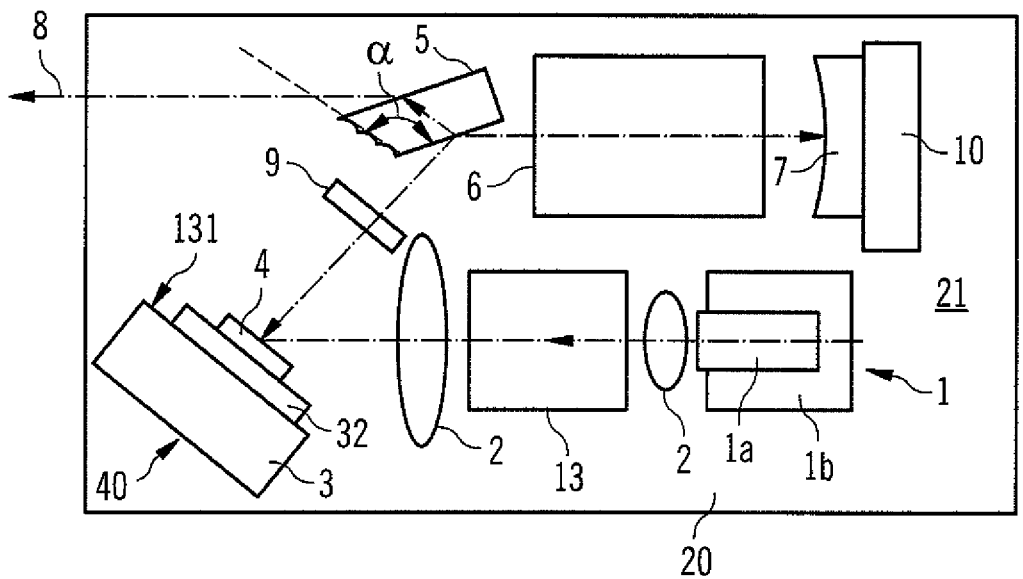
FIG. 4 shows a fourth exemplary embodiment of a semiconductor laser module described here.

A fourth exemplary embodiment of a semiconductor laser module described here is explained in conjunction with FIG. 4. As a modification with respect to the exemplary embodiment in FIGS. 2A and 2B, in the exemplary embodiment in FIG. 4 the coupling-out unit 5 used is a plane mirror which is trimmed in angular fashion in order thereby to create more space for the etalon. In other words, the angle α is produced by means of sawing. The plane mirror therefore has singulation traces from the sawing which are illustrated schematically in the figure.

Overall, the semiconductor laser module described here is distinguished by a particularly small size. In other words, the structural space that has to be made available for the use of the semiconductor laser module is particularly small. The semiconductor laser module can therefore be used for example as part of an optical projection device in small devices such as mobile telephones, notebooks, laptops or games consoles.

The integration of the etalon 9 into the path for the electromagnetic radiation having a fundamental wavelength, that is to say between the semiconductor laser 40 and the coupling-out unit 5, proves to be particularly advantageous since no losses in the frequency-converted radiation 8 arise as a result. The etalon is arranged in such a way that only radiation having a fundamental wavelength which has not been converted in wavelength by the frequency conversion device 6 passes through the etalon 9.

Figure 5A:
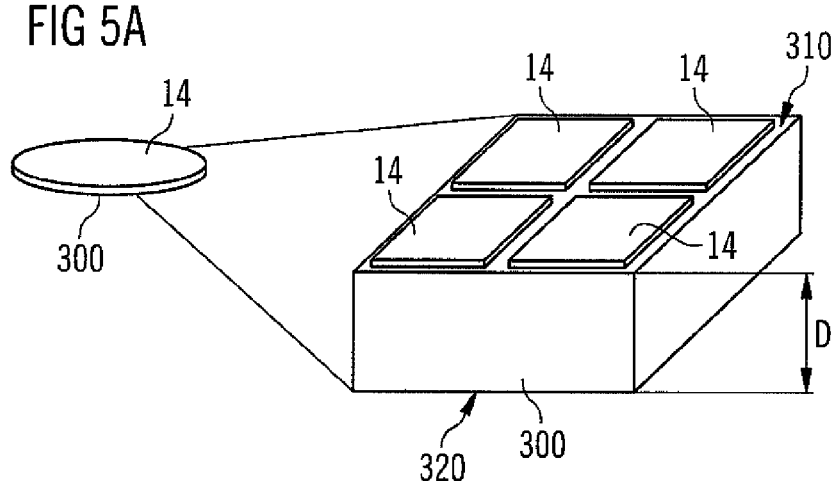
FIGS. 5A to 5D describe a production method for a semiconductor laser used in an exemplary embodiment of a semiconductor laser module described here.

FIG. 5A shows, in a schematic perspective illustration, a first method step for producing a multiplicity of semiconductor lasers such as are used in a semiconductor laser module described here. In this first method step, firstly a carrier wafer 300 is provided. The carrier waver 300 consists of silicon or aluminum nitride. The carrier wafer 300 has a uniform thickness D. In this case, the thickness preferably lies between 0.4 mm and 1.5 mm. The carrier wafer comprises a top side 310 and an underside 320. Top side 310 and underside 320 of the carrier wafer 300 run substantially plane-parallel to one another. In other words, the deviation from plane-parallelism is preferably less than 0.1°. In this case, FIG. 5A shows on the left the entire carrier wafer and on the right an enlarged illustration of an excerpt from the carrier wafer.

A contact metallization 14 formed by rectangular TiPtAu contact areas is applied to the top side 310 of the carrier wafer. The contact metallization serves for subsequent mechanical fixing of semiconductor laser chips.

Figure 5B:
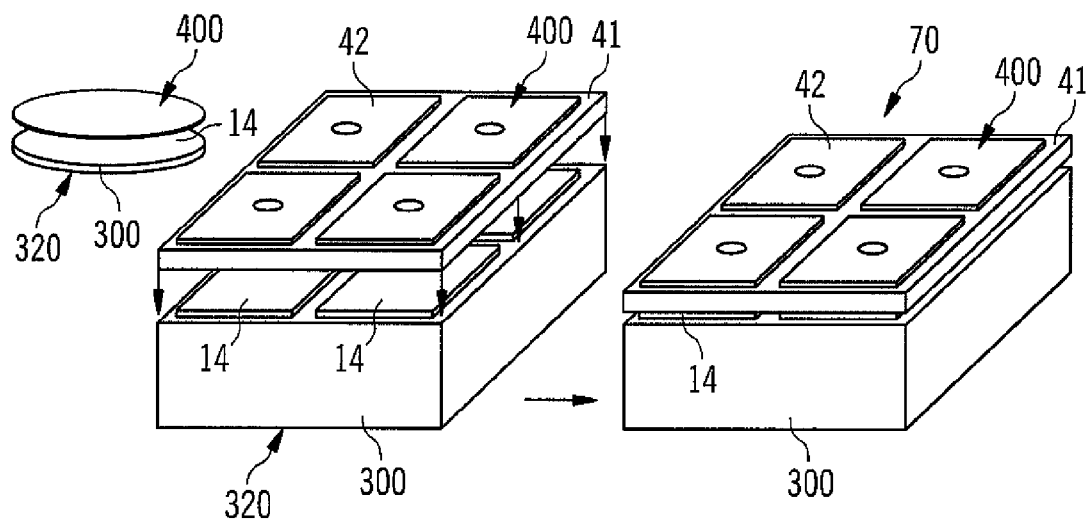

A further method step for producing a multiplicity of semiconductor lasers is described on the basis of schematic perspective drawings in conjunction with FIG. 5B. In this method step, a wafer assembly 400 of semiconductor laser chips 4 is applied to the carrier wafer 300. In this case, the wafer assembly 400 has a solder metallization, which is not illustrated in the figures, on its rear side facing the carrier wafer 300.

In this case, the wafer assembly 400 of semiconductor laser chips consists for example of a growth substrate 41 to which epitaxially deposited layers are applied. In this case, the epitaxially deposited layers comprise, inter alia, active layers suitable for generating laser radiation.

The wafer assembly is applied to the carrier wafer 300 with an accuracy of a few micrometers. The solder metallization of the wafer assembly is subsequently soldered to the contact metallization 14, thus producing a mechanically fixed connection, that is to say an assembly 70 of wafer assembly 40' and carrier wafer 300.

An adhesive film clamped in a frame is preferably applied to the underside 320—remote from the wafer assembly 400—of the carrier wafer 300. The adhesive film is, for example, a self-adhesive foil which is bonded to the underside 320 of the carrier wafer 300. The edge of this foil can be clamped in a frame. After singulation of the assembly to single chips (see below) the foil is expanded in that the foil is pulled apart in different directions. In this way the distance between the individual chips (which are bonded to the foil) is enlarged.

Figure 5C:
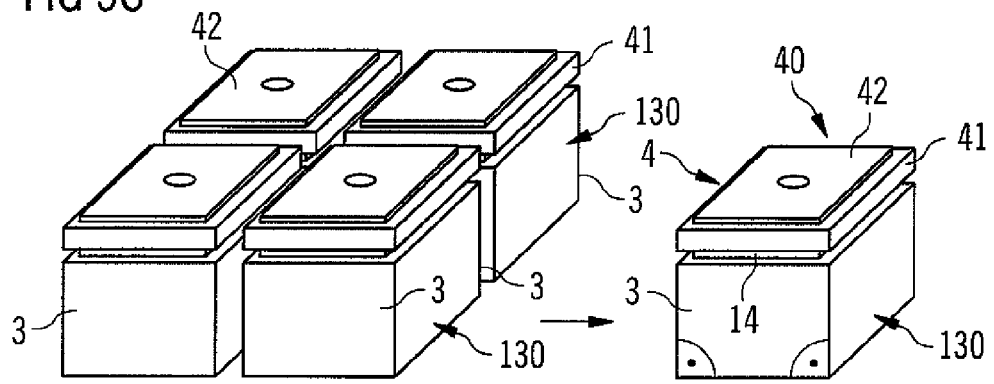

A further method step of the method is described in a schematic perspective illustration in conjunction with FIG. 5C. In this method step, the assembly composed of wafer assembly 400 and carrier wafer 300 is singulated to form individual semiconductor lasers 40 comprising a mounting block and a semiconductor laser chip 4. The singulation can be effected for example by a laser separating method or wafer sawing. After the sawing, the film to which the assembly 70 is applied is expanded. In this way, the individual chips separate from one another along the singulation lines. Mounting areas 130 of individual mounting blocks 3 are produced by the singulation. On account of the material used for the carrier wafer 300 and the singulation process used, the mounting areas 130 are formed in very planar fashion and have at most a small angle error relative to the perpendicular to the top side 131 of the mounting block 3. The angle error is less than 0.3° in this case.

Figure 5D:
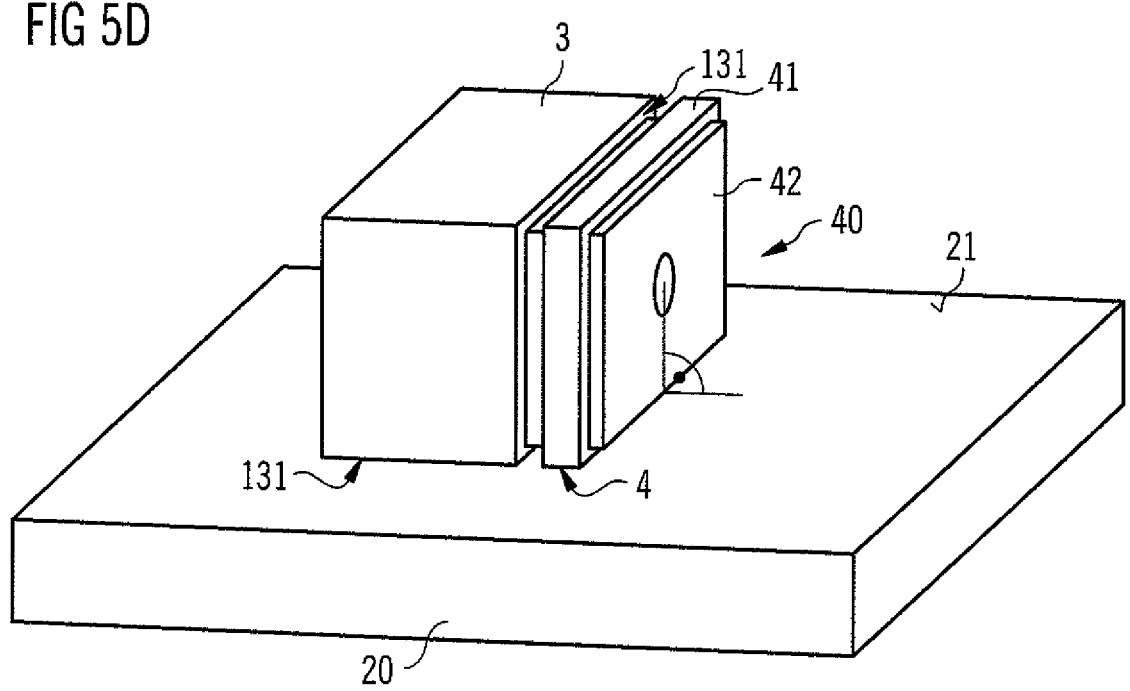

FIG. 5D shows, in a schematic perspective illustration, a semiconductor laser 40 produced in accordance with the method, said semiconductor laser being mounted by its mounting area 130 onto the module carrier 20. As can be seen from FIG. 5D, the top side—remote from the module carrier 3—of the semiconductor laser chip 4 and the mounting area 21 of the module carrier 20 form a right angle with one another, on account of the small angle error.

Figure 6A:
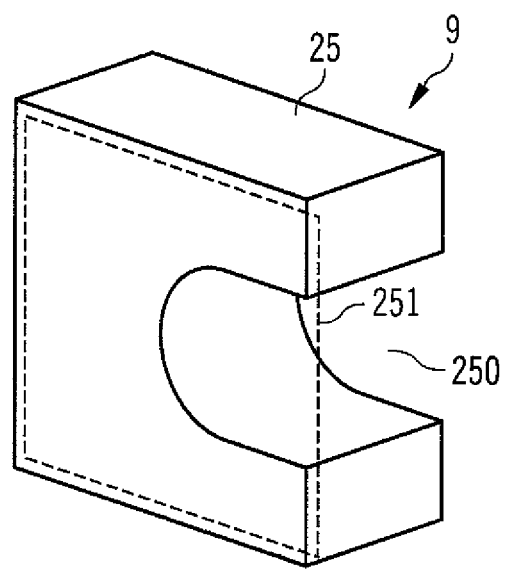
FIGS. 6A and 6B show an etalon such as is used in an exemplary embodiment of a semiconductor laser module described here.

FIG. 6A shows, in a schematic perspective illustration, an exemplary embodiment of an etalon 9 described here. The etalon 9 comprises a carrier 25, which consists for example of silicon or glass. An etalon layer 251 is fixed onto the carrier 25. The etalon layer 251 preferably consists of a glass, for example of a float glass. The etalon layer 251 can be fixed to the carrier 25 by means of anodic bonding or adhesive bonding. The carrier 25 has a recess 250. The recess 250 can be produced before and after the fixing of the etalon layer 251 to the carrier 25. By way of example, the recess is produced after the fixing of the etalon layer 251 by means of an etching process. The recess 250 is provided at a location in the carrier 25 at which electromagnetic radiation that is intended to be frequency-selected by the etalon layer 251 passes through the etalon layer 251. The carrier 25 therefore has with the recess 250 a cutout through which the laser beam can pass exclusively through the etalon layer. The diameter of the recess 250 is between at least 0.5 mm and at most 0.8 mm.

Figure 6B:
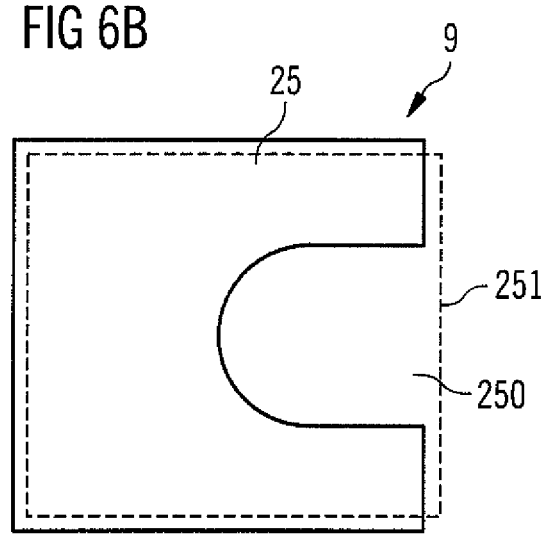

As can be seen in particular also from the schematic plan view in FIG. 6B, the recess 250 can be embodied in U-shaped fashion, for example.

The thickness of the etalon layer 251 is preferably between 20 and 50 μm, in particular 30 μm. The carrier 25 and the etalon layer 251 have in total a constant thickness in a beam direction of preferably at least 0.2 mm and at most 1.5 mm. Such a thickness of the carrier 25 provides for a sufficient mechanical stability of the etalon 9.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. A semiconductor laser module comprising:
a module carrier having a mounting area;
a pump device arranged on the mounting area;
a vertical external cavity surface emitting laser (VECSEL) arranged on the mounting area; and
a frequency conversion device arranged on the mounting area,
wherein the mounting area of the module carrier has an area content of at most 100 mm$^2$, and
wherein the VECSEL comprises:
a mounting block having a side and a mounting area, and
at least one semiconductor VECSEL chip arranged on the side of the mounting block,
wherein the mounting area of the mounting block runs substantially perpendicular to the side of the mounting block, and
wherein the semiconductor VECSEL chip is fixed with the mounting area of the mounting block on the mounting area of the module carrier, and
wherein a height of the semiconductor laser module measured from a side of the module carrier remote from the mounting area to a highest extent of the semiconductor laser module is at most 3.5 mm.

2. The semiconductor laser module as claimed in claim 1, wherein the height of the semiconductor laser module is at most 3 mm.

3. The semiconductor laser module as claimed in claim 2, wherein the mounting area of the mounting block of the semiconductor VECSEL chip is produced by a singulation process.

4. The semiconductor laser module as claimed in claim 1, wherein the mounting block contains a non-metallic material or consists of a non-metallic material.

5. The semiconductor laser module as claimed in claim 1 wherein the mounting block has a substantially uniform thickness of at least 0.5 mm and at most 1.7 mm.

6. The semiconductor laser module as claimed in claim 1, comprising an etalon, which is provided as a frequency-selective element in the semiconductor laser module and is arranged on the mounting area of the module carrier,
wherein the etalon comprises an etalon layer consisting of a glass that is fixed, in particular bonded, onto an etalon carrier, and
wherein the etalon layer has a uniform thickness of at least 20 µm and at most 50 µm, in particular 30 µm.

7. The semiconductor laser module as claimed in claim 6, wherein the etalon carrier contains at least one of the following materials or consists of one of the following materials: silicon, glass.

8. The semiconductor laser module as claimed in claim 6, wherein the etalon has a constant thickness of at most 0.7 mm.

9. The semiconductor laser module as claimed in claim 6, wherein the etalon is arranged in such a way that no frequency-converted radiation passes through the etalon layer during operation of the semiconductor laser module.

10. The semiconductor laser module as claimed in claim 1, wherein a resonator length (D1+D2) is at most 10 mm.

11. The semiconductor laser module as claimed in claim 1, wherein the side of the semiconductor VECSEL chip that faces away from an emission surface of the semiconductor VECSEL chip through which radiation is emitted during operation of the semiconductor laser module is completely covered by the mounting block.

12. A semiconductor laser module comprising:
a module carrier having a mounting area;
a pump device arranged on the mounting area;
a vertical external cavity surface emitting laser (VECSEL) arranged on the mounting area; and
a frequency conversion device arranged on the mounting area,
wherein the mounting area of the module carrier has an area content of at most 100 mm$^2$, and
wherein the VECSEL comprises:
a mounting block having a side and a mounting area, the mounting block being a non-metallic material, and
at least one semiconductor VECSEL chip arranged on the side of the mounting block,
wherein the mounting area of the mounting block runs substantially perpendicular to the side of the mounting block, and
wherein the semiconductor VECSEL chip is fixed with the mounting area of the mounting block on the mounting area of the module carrier, and
wherein a height of the semiconductor laser module is at most 3.5 mm.

* * * * *